(12) United States Patent
Aitken et al.

(10) Patent No.: US 6,980,943 B2
(45) Date of Patent: Dec. 27, 2005

(54) FLOW FOR VECTOR CAPTURE

(75) Inventors: Robert C. Aitken, San Jose, CA (US); Stuart L. Whannel, San Jose, CA (US); Jian-Jin Tuan, Palo alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 764 days.

(21) Appl. No.: 10/020,562

(22) Filed: Dec. 13, 2001

(65) Prior Publication Data

US 2003/0115033 A1 Jun. 19, 2003

(51) Int. Cl.$^7$ .............................................. G06F 17/50
(52) U.S. Cl. .......................... 703/14; 703/13; 703/17; 714/724; 714/738; 714/741; 714/744; 714/745
(58) Field of Search .............................. 703/13, 14, 17; 714/724, 738, 741, 744, 745

(56) References Cited

U.S. PATENT DOCUMENTS

| | | |
|---|---|---|
| 5,448,571 A | 9/1995 | Hong et al. |
| 5,938,785 A * | 8/1999 | Dargelas ...................... 714/744 |
| 6,101,622 A | 8/2000 | Lesmeister |
| 6,233,707 B1 * | 5/2001 | Potter et al. ................. 714/724 |

* cited by examiner

Primary Examiner—Jean R. Homere
Assistant Examiner—Herng-der Day

(57) ABSTRACT

A method and system for generating a synchronous sequence of vectors from information originating within an asynchronous environment is disclosed. A simulated asynchronous sequence is synchronized by extracting a state at each clock period to generate a simulation synchronous sequence. This sequence is manipulated first to include short delays for generating an asynchronous short-delay sequence and second to include long delays for generating an asynchronous long-delay sequence. An overlay is separately performed among the clock periods of the asynchronous short-delay sequence and the asynchronous long-delay sequence to respectively identify a first interval and a second interval. The first interval and the second interval are independently duplicated in successive clock periods to respectively generate a synchronous short-delay sequence and a synchronous long-delay sequence. An overlay is performed on the two sequences to enable generation of the synchronous sequence of vectors for verifying operations of an IC design by a tester.

20 Claims, 9 Drawing Sheets

FLOW FOR VECTOR CAPTURE

TECHNICAL FIELD

The invention relates generally to the verification and testing of electrical circuits and more particularly to a method and system for generating synchronous test vectors from information originating within an asynchronous environment.

BACKGROUND ART

An important phase in integrated circuit (IC) chip design and manufacturing involves implementing a software verification tool to substantiate the functionality of a prototype design prior to fabrication. Chip parameters are specified and are modeled utilizing a high-level hardware description language (HDL), such as Verilog, VHDL, or C functions, to describe the IC at a higher level of abstraction than gates or transistors. Verifying the operations of the prototype prior to fabrication ensures that the requirements defined by the chip specifications are satisfied, from layout to electrical parameters. In particular, the verification process provides feedback to the engineers, so that any detected defects can be corrected. This is potentially critical, since eliminating problems at an early stage results in substantial savings in the time and cost of manufacturing.

Typically, the HDL simulation can be divided into a functional analysis and a timing analysis. The functional analysis verifies that the design logic performs as intended (i.e., whether the chip will work or not) in an "event-driven" asynchronous environment in which information regarding timing is not considered. Each internal component may be assumed to include a given time delay. Alternatively, an output state may incur a timing delay that is different from that of a next output state. Simulated test signals propagate from an input end to an output end of the design to provide output signals that are subsequently compared with predetermined target signals (i.e., anticipated reference signals). Based on any unexpected outputs, design parameters are modified when necessary.

Independent of the functional analysis, the timing analysis focuses on whether the design logic operates within time constraints. This is important, since the prototype must be made compatible with other devices. A timing margin is generated based on factors such as the physical characteristics of the design, including lengths of internal transmission lines and bus specifications. Timing parameters, including propagation delay, strobe time, and setup and hold times are considered.

Data from both the functional analysis and the timing analysis is captured. The captured data may be used by an automatic test generator (ATG) to create test vector files of state data for subsequent physical testing of a device under test (DUT) that is fabricated based on the prototype design. The testing is typically performed by a conventional "time-driven" ATG operating in a synchronous environment in which data is sampled at a predetermined fixed instance in every successive tester cycle.

A concern is that there may be at least one occasion of an inability of the synchronous tester to properly sample DUT data as a result of an asynchronous variability of data from the DUT. Since the tester is configured to sample data at predetermined instances in successive tester cycles while operating in the synchronous environment, the tester is not well adapted for sampling incoming data from the DUT that changes states at unpredictable times due to its asynchronous behavior. This is problematic, because if the timing margin of the DUT does not include a sufficient time period before and after an active tester edge (i.e., $T_{setup}$ and $T_{hold}$) needed by the tester for sampling the output data from the DUT, the tester may exhibit responses that are different from those generated during test simulation. Consequently, the test vectors produced by the ATG based on the simulated data may not trigger the intended behavior within the asynchronous prototype design. Properly identifying the precise placement of the active tester edges for data sampling is often iteration intensive. That is, in attempting to fix the placement of a tester edge to correspond to a sampling instance, the location is often determined by probing one instance after another until an adequate timing is found.

What is needed is a method for test data generation in which timing variability from an asynchronous device can be properly sampled by a synchronous tester.

SUMMARY OF THE INVENTION

The Invention is a method and system for generating a synchronous sequence of test vectors from information originating within an asynchronous environment. In a first sequence-generating step, a simulation synchronous sequence of states for functionally verifying proper operations of a simulated Integrated circuit (IC) design Is provided in a system simulation device (i.e., an IC design tester). The sequence is generated from a simulated asynchronous sequence by extracting a state of the simulated asynchronous sequence at each clock period of a reference clock. Preferably, the reference clock period is equivalent to a tester clock period. Abbreviated system-related delays (which may be "best case" delays encountered within the intended system in which the IC is to be integrated) and extended system-related delays (which may be "worst case" delays encountered within the intended system) are preferably considered in this first sequence-generating step.

In a second sequence-generating step, the simulation synchronous sequence is manipulated once to include potentially different short timing delays for generating an asynchronous short-delay sequence and is manipulated a second time to include potentially different long timing delays for generating an asynchronous long-delay sequence. The short timing delays and the long timing delays are delays associated with the tester IC being simulated. Similar to the system-related delays of the first step, these short and long delays may be individually determined on the basis of "best case" (minimum) and "worst case" (maximum) time requirements, but these time requirements are related to either or both of the IC and the tester, rather than to the intended system.

As a preliminary to a third sequence-generating step, separate timing overlays are performed among the clock periods of the asynchronous short-delay sequence and among the clock periods of the asynchronous long-delay sequence to respectively identify a first state overlapping time interval and a second state overlapping time interval. Each state "overlapping" time interval is that region of the cumulative clock period that includes at least a portion of the state of every clock period that is "overlaid" (i.e., time aligned) to form the cumulative clock period. Within the third step, a clock period having a state with the timing characteristics of the first state overlapping time interval within its cumulative clock period is duplicated in a succession of clock periods to generate a synchronous short-delay sequence. In the same manner, a clock period having a state with the timing characteristics of the second state overlapping time interval within its cumulative clock period is duplicated within a succession of clock periods to generate a synchronous long-delay sequence.

Finally, in a fourth sequence-generating step, a combined timing overlay is performed on the synchronous short-delay and long-delay sequences to provide a single stream of sampling time intervals that defines the synchronous sequence of test vectors for testing the IC design.

Returning to the first sequence-generating step, the original simulated asynchronous sequence of states is created for verifying the functionality of a prototype design of an IC chip without any consideration of timing constraints. The asynchronous sequence is event-driven and non-periodic (i.e., a timing delay of a first state may be different from a timing delay of a next state). As previously noted, the asynchronous sequence is synchronized by extracting a state at each clock period to generate the simulated synchronous sequence of states. The clock period preferably reflects the tester clock period of the IC design tester.

As a component of the first step, the timing constraints that are imposed by the intended system are considered. The abbreviated (minimum) and extended (maximum) system-related delays of the anticipated system environment are independently introduced to the simulated synchronous sequence of states to respectively generate a simulated synchronous abbreviated-delay sequence of states and a simulated synchronous extended-delay sequence of states. The timing delays of the system environment are indicative of the load characteristics of the components within the intended system. As an example of an application, the intended system may be a laser printer. In one embodiment, the abbreviated-delay sequence represents the best case scenario, or minimum timing delays, of the components within the system in which the IC will be operating, excluding any delay associated with the IC itself and with the IC design tester. Similarly, the extended-delay sequence represents the worst case scenario, or maximum timing delays, of the components within the system environment, excluding delays associated with the IC and the IC design tester.

Also within the first sequence-generating step, a first time overlay is performed. The time periods of the simulated synchronous abbreviated-delay sequence and the simulated synchronous extended-delay sequence are time-aligned to identify a stream of intersecting timing regions (or "overlapping time intervals") between corresponding states of the two sequences in order to define the simulation synchronous sequence that is used in the second step. In a case in which there is not an acceptable number of intersecting timing regions for defining an operable simulation synchronous sequence, the simulated synchronous extended-delay sequence is adapted to be the simulation synchronous sequence to be used. In one embodiment, there is an unacceptable number of intersecting timing regions in a case when there is no intersecting timing region upon performing the time overlay on the two sequences.

Turning to the second sequence-generating step, the simulation synchronous sequence from the first step is independently executed to include short timing delays for generating the asynchronous short-delay sequence and long timing delays for generating the asynchronous long-delay sequence. In one embodiment, the short timing delays include a best case tester-load timing delay of the tester and a best case chip-load timing delay of the IC. Each tester-load timing delay is the internal delay of the tester for a particular event, including delay that results from capacitances and resistances that are associated with the tester's circuitry and connections. The values of the delays may be provided by the manufacturer of the tester. The chip-load timing delay is the internal delay of a fabricated chip based on the simulated IC design, with the value of the delay closely approximating the anticipated delay of the fabricated chip. Since the chip is designed to perform different types of functions in which the times taken to perform different functions vary, the timing delay associated with a first output state may be different from that of a second and subsequent output state. The change in timing delay between the different output states is the basis for the asynchronous variability exhibited by the chip. Thus, the generated asynchronous short-delay and long-delay sequences are subjected to asynchronous variability. In a case in which a delay has caused a state to cross a boundary into a next clock period, the sequence may be shifted along the time domain so that at least a portion of the crossed-over state is shifted back to its respective clock period. Alternatively, the crossed-over state may be masked to avoid a faulty sampling region.

As previously described, a time overlay is performed among the time periods of the asynchronous short-delay sequence to identify a first overlapping time interval. The overlaying includes correlating successive clock periods (with the differences in delays remaining intact) and identifying an intersecting time interval (i.e., region of coincidence) among the states of the cumulative period. In an event in which a state does not coincide with the overlapping time interval, the non-overlapping time interval may be masked. The first overlapping time interval is duplicated by positioning the interval at a substantially identical location in successive clock periods to generate the synchronous short-delay sequence.

Independent of identifying the first overlapping time interval, a second overlapping time interval is identified. A time overlay is performed among the time periods of the asynchronous long-delay sequence to identify the second overlapping time interval of states. In an event in which a state does not coincide with the overlapping time interval, the non-overlapping time interval may be masked. The overlaying includes correlating successive clock periods and identifying an intersecting time interval among the states of the cumulative period. The second overlapping time interval is duplicated by positioning the interval at a substantially identical location in successive clock periods to generate the synchronous long-delay sequence.

In the final sequence-generating step, a sequence-to-sequence overlay is performed. The synchronous short-delay sequence and the synchronous long-delay sequence are time-aligned to determine a stream of sampling time intervals between corresponding states of the synchronous short-delay and long-delay sequences. The stream of sampling time intervals defines the sequence of synchronous test vectors.

A sampling instance is selected at a timing location within the sampling time interval to correspond to a rising edge of a tester clock cycle of the IC design tester. The selection of the sampling instance includes allocating a sufficient time interval (i.e., $T_{setup}$) before the sampling instance and a sufficient time interval (i.e., $T_{hold}$) after the sampling instance, but within the sampling time interval, to ensure an adequate sampling of the vector by the tester. Since the sequence of sampling time intervals for defining the sequence of test vectors is synchronous, the selection of the location of the sampling instance in one sampling time interval will be repeated for each sampling time interval in the synchronous sequence of test vectors.

The synchronous sequence of test vectors is executed to accommodate the short timing delays and the long timing delays for verifying timing correctness. In the embodiment in which the short timing delays include the best case tester-load timing delay and the best case chip-load timing delay, and the long timing delays include the worst case tester-load timing delay and the worst case chip-load timing delay, the sequence is verified to ensure that the vectors from the simulated IC can be adequately sampled by the tester within a testing environment that includes timing delays occurring from all of the system, the chip and the tester.

An advantage of the invention is that the sampling time interval that defines the test vector can be determined without the cumbersome and time consuming task of probing one location after another to find an adequate sampling instance. Moreover, detailed knowledge relating to the timing delays of every low-level circuit within the testing environment is not required. Thus, the invention allows for a quick convergence of the sampling time intervals within the synchronous sequence of test vectors. Another advantage is that since the synchronous sequence of test vectors has been verified against the testing environment, errors resulting from sampling at undesired locations can be eliminated.

DETAILED DESCRIPTION

The method and system for generating a synchronous sequence of test vectors comprises acquiring timing data from all of an intended system environment, an IC design tester environment and an integrated circuit (IC) chip environment. The intended system is the one in which the IC is to be incorporated. For example, the intended system may be a laser printer.

Figure 1:
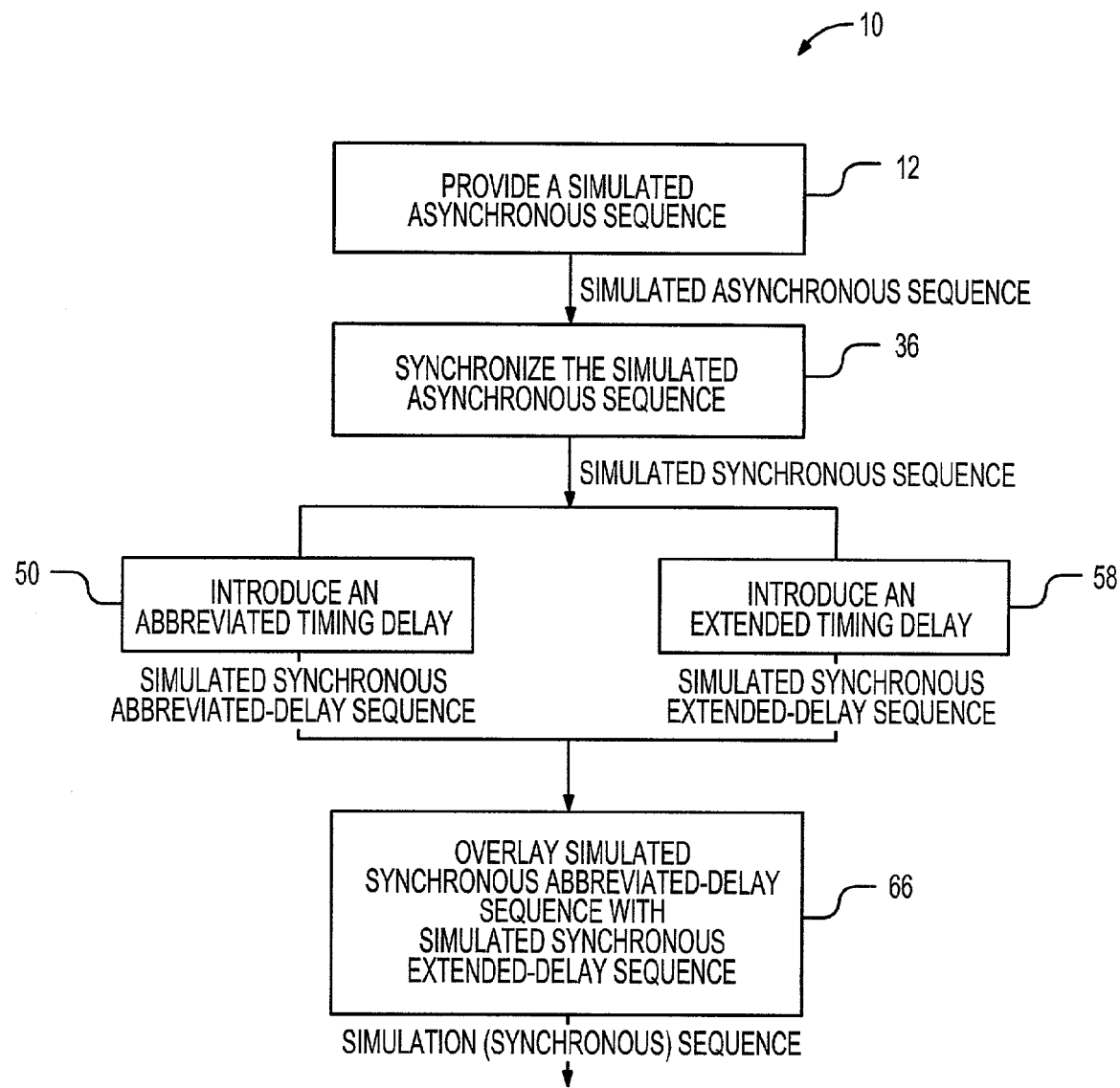
FIG. 1 is a process flow diagram for generating a simulation synchronous sequence of states from information originating within an asynchronous environment in accordance with the invention.

FIG. 1 shows a process flow diagram 10 for generating a simulation (synchronous) sequence of states from information originating within an asynchronous environment. In step 12, a simulated asynchronous sequence of states for functionally verifying proper operations of a simulated IC design is provided under a system simulation environment. The simulated asynchronous sequence determines that the internal components (e.g., gates) of a simulated IC interact and function in the manner intended. In one embodiment, the simulated IC is an Application Specific Integrated Circuit (ASIC) to be incorporated as part of the system environment. The system environment may be an operating environment of a laser printer having member devices such as ASICs, memories, drivers and controllers. A recording file, such as a Verilog Control Dump (VCD) file, captures the sequence and the timing information associated with each transition of the sequence.

Figure 2A:
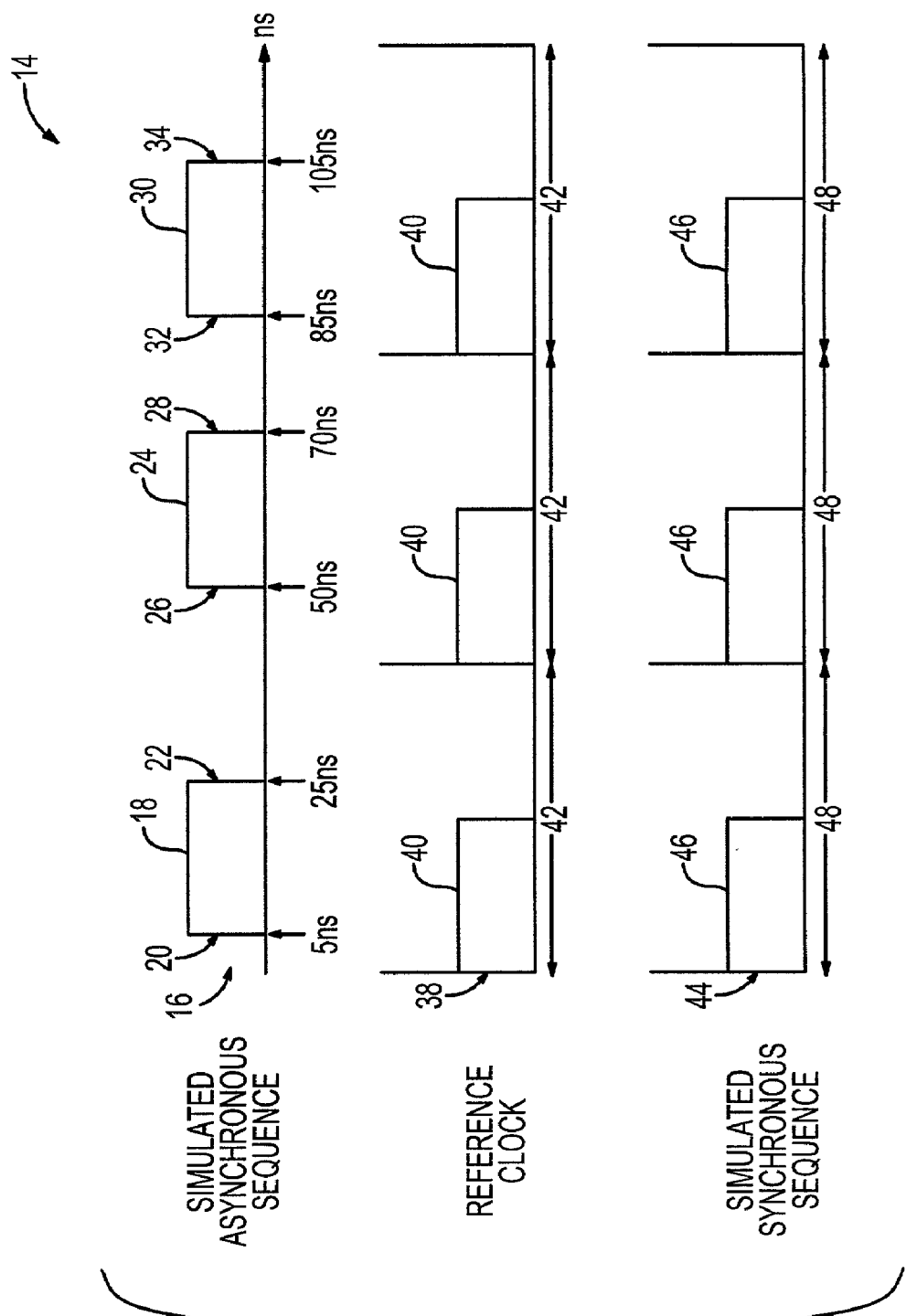
FIG. 2A is a timing diagram illustrating the timing relationship for generating a simulated synchronous sequence in accordance with the process flow diagram of FIG. 1.

The simulated sequence is "asynchronous," since the occurrences of the cycles containing state information is event-driven and non-periodic. That is, there is no timing constraint imposed upon the cycles. A timing diagram 14 of FIG. 2A shows a partial exemplary simulated asynchronous sequence 16. The asynchronous sequence includes a first cycle 18 having a first rising edge 20 at 5 ns and a first falling edge 22 at 25 ns, a second cycle 24 having a second rising edge 26 at 50 ns and a second falling edge 28 at 70 ns, and a third cycle 30 having a third rising edge 32 at 85 ns and a third falling edge 34 at 105 ns. The non-periodic occurrence of the cycles is shown by a difference of the time intervals between adjacent cycles. In an exemplary case in which the rising edge of each cycle is selected as a reference point, the time interval of 45 ns between the first rising edge (at 5 ns) of the first cycle and the second rising edge (at 50 ns) of the second cycle is different from the time interval of 35 ns between the second rising edge (at 50 ns) of the second cycle and the third rising edge (at 85 ns) of the third cycle.

Returning to FIG. 1, step 36 is a step of synchronizing the simulated asynchronous sequence 16 to generate a simulated synchronous sequence of states. The asynchronous sequence can be synchronized by sequentially extracting a state of the asynchronous sequence at each periodic clock. FIG. 2A shows a reference clock 38 having successive cycles 40 in respective base periods 42. Each base period comprises a time interval that is equivalent to a time interval of a next base period. Preferably, the time interval of the base period corresponds to the time interval of a tester clock period of an IC design tester. In a sequential manner, by extracting a state of the asynchronous sequence 16 at each periodic clock, the states are phase-locked and time-aligned to an identical timing location in a base period to generate a simulated synchronous sequence 44 of states. Each cycle 46 of the synchronous sequence coincides with the clock cycle 40 of the reference clock. Moreover, the time period 48 of the synchronous sequence corresponds to the base period 42 of the reference clock.

For each member device (e.g., a controller or a driver) operating within the intended system environment, there is a timing delay. Each member device includes a best case timing delay and a worst case timing delay, resulting from a load variation inherent in the device. A best case timing delay and a worst case timing delay of the system environment may be acquired by adding respective best case timing delays and worst case timing delays for every member device of the system.

Figure 2B:
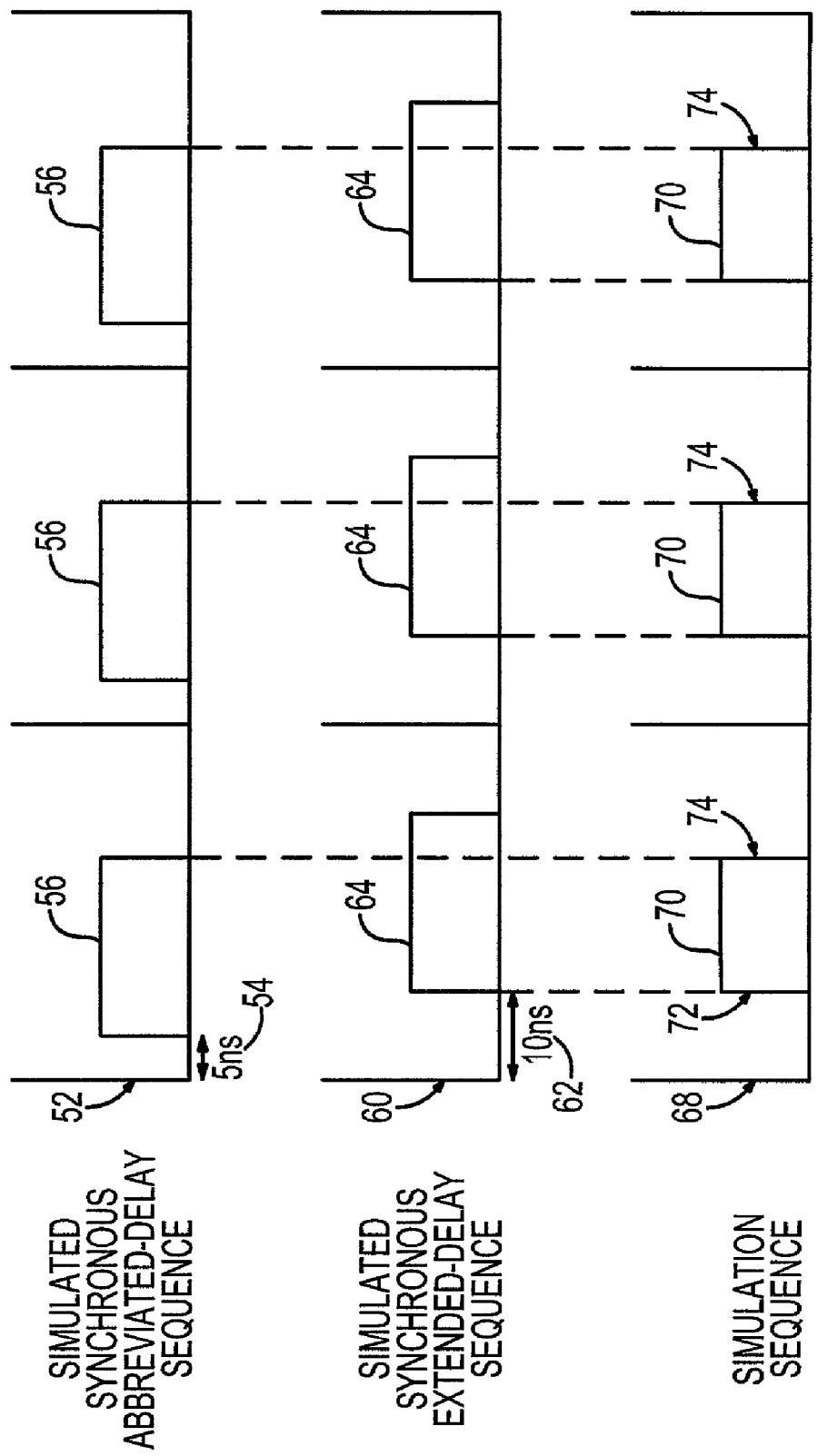
FIG. 2B is a timing diagram illustrating the timing relationship for generating a simulation synchronous sequence in accordance with the process flow diagram of FIG. 1

In step 50 of FIG. 1, an abbreviated timing delay of the system environment is introduced to the simulated synchronous sequence 44 of FIG. 2A to generate a simulated synchronous sequence of states. In one embodiment, the abbreviated delay is an estimated best case, or a minimum timing delay, of the system environment, excluding any delay associated with the chip or the tester. However, the delay may be adjusted from the minimum in order to allow some error tolerance. FIG. 2B shows a simulated synchronous abbreviated-delay sequence 52 having an exemplary timing delay 54 of 5 ns. By introducing the timing delay 54, each cycle 46 of the simulated synchronous sequence 44 is shifted along the time domain by 5 ns, resulting in the simulated synchronous abbreviated-delay sequence 52. The simulated synchronous abbreviated-delay sequence includes successive base periods having shifted cycles 56.

Independent of introducing the abbreviated timing delay to the simulated synchronous sequence 44, step 58 of FIG. 1 introduces an extended timing delay of the system environment to generate a second simulated synchronous sequence of states. In one embodiment, the extended delay is the estimated worst case, or a maximum timing delay, of the system environment, excluding any delay associated with the chip or the tester. However, there may be an error tolerance adjustment. FIG. 2B shows a simulated synchronous extended-delay sequence 60 having a timing delay 62 of 10 ns. By introducing the timing delay, each cycle 46 of the simulated synchronous sequence 44 of FIG. 2A is shifted along the time domain by 10 ns, resulting in the simulated synchronous extended-delay sequence 60. The simulated synchronous extended-delay sequence includes repeating shifted cycles 64.

In step 66 of FIG. 1, a time overlay is performed on the simulated synchronous abbreviated-delay sequence 52 and the simulated synchronous extended-delay sequence 60 to generate a simulation sequence 68 of FIG. 2B. Specifically, the synchronous sequences 52 and 60 are time aligned and correlated to identify successive overlapping cycles 70 that define the simulation sequence 68. The overlapping cycles are the coincident time interval between each cycle 56 and the cycle 64 within the corresponding base period. The overlapping cycle is characterized by a rising edge 72 that coincides with a rising edge of the cycle 64 (of the sequence 60) and by a falling edge 74 that coincides with a falling edge of the cycle 56 (of the sequence 52). Since the overlaying is performed on synchronous sequences 52 and 60, the resulting simulation sequence is also synchronous. In a case in which there is not an acceptable number of overlapping cycles generated between the simulated synchronous abbreviated-delay and extended-delay sequences 52 and 60, the extended-delay sequence 60 is adapted to be the simulation sequence 68. In one embodiment, there is an unacceptable number of overlapping cycles in a case when there is no intersecting timing region upon performing the time overlay on the two sequences.

While the simulation sequence 68 provides successive synchronous time intervals for data samplings, the intervals only include timing delays associated with the load characteristics of the system environment and not any load characteristic associated with the tester and the IC chip. As a result, the simulation sequence may not be adequate in an actual testing environment which must accounted for the tester and IC chip.

Figure 3:
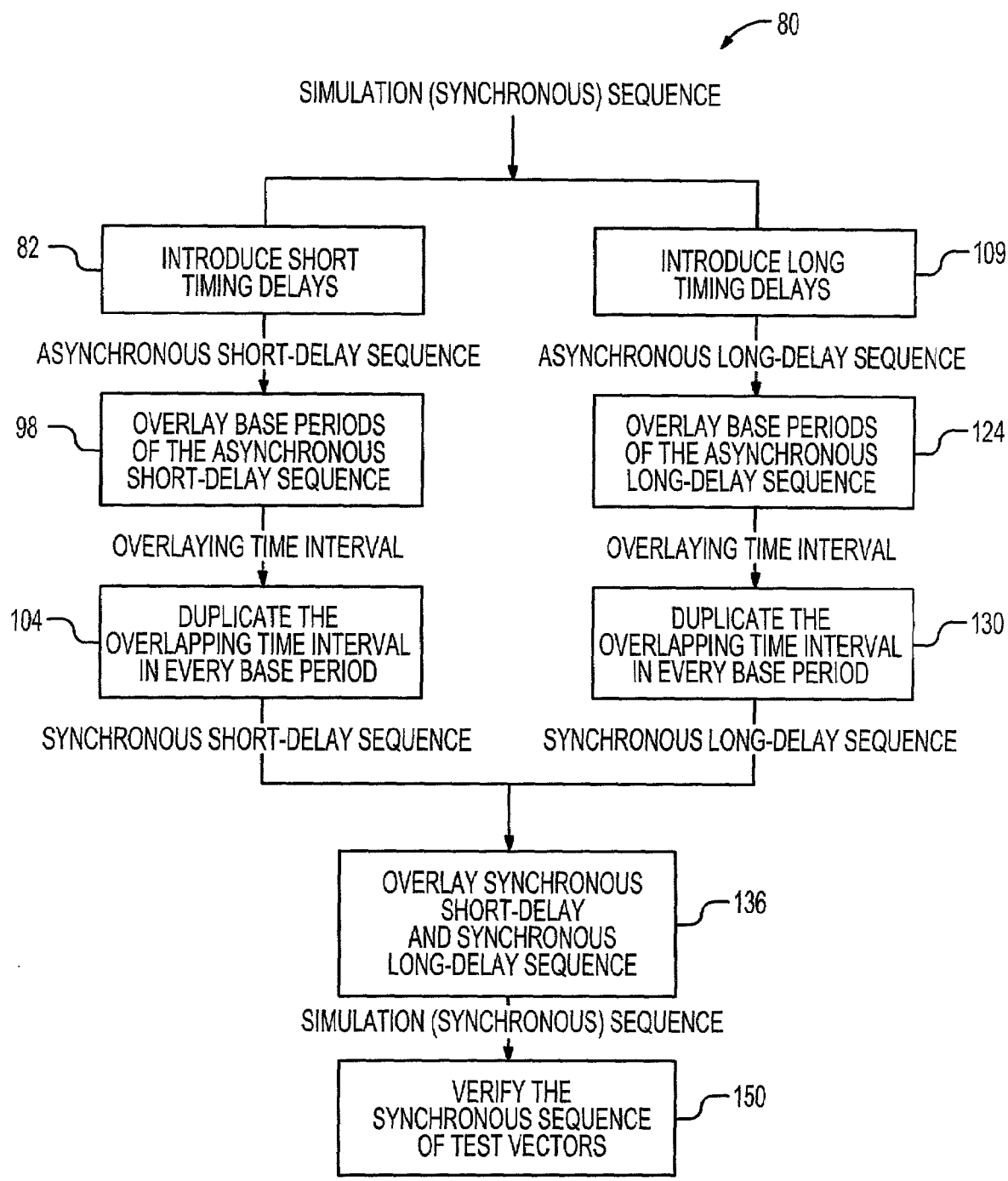
FIG. 3 is a process flow diagram for generating a synchronous sequence of test vectors in accordance with the invention.

FIG. 3 shows a process flow diagram 80 for generating a synchronous sequence of test vectors from the simulation sequence 68 of FIG. 2B. The synchronous sequence of test vectors includes timing delays associated with the tester and the IC chip.

The tester-load timing delay is considered in isolation from any timing delays associated with the system and the chip. The tester delay includes delays resulting from the load impedance of the device. There is a best case, or a minimum timing delay, and a worst case, or a maximum timing delay, associated with a load variation inherent within the tester. That is, even with a same type of tester, a tester may experience a slight variation in delays from a different tester. In one embodiment, the best case and the worst case timing delays are provided by the specification from the manufacturer.

The chip-load timing delay is considered in isolation from any timing delays associated with the system and the tester. The delay should closely approximate the delay of the fabricated chip and is calculated at the chip-level in which every operational delay associated with each internal element (e.g., a transistor or a resistor) is included. Additionally, since different internal elements may be involved in different types of functions (e.g., executing an adding function versus a multiplication function), the time taken to perform one function may vary from the time taken to perform a different function. Thus, the timing delay associated with a first output state may be different from that of the next output state. The difference in delay from the first output state to the next output state is the basis for an asynchronous variability among the states.

Figure 4:
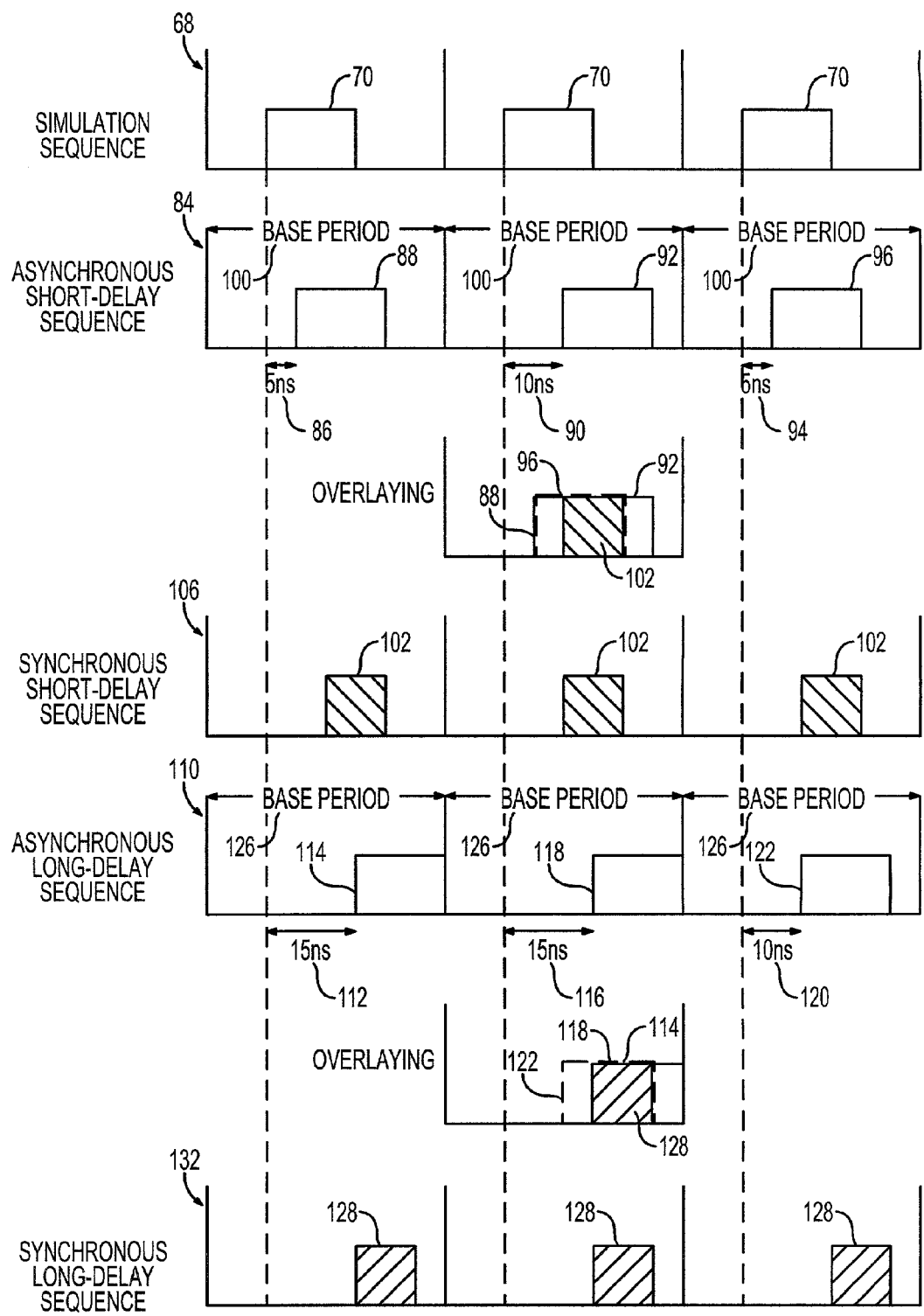
FIG. 4 is a timing diagram illustrating the timing relationship for generating a synchronous short-delay and long-delay sequences in accordance with the process flow diagram of FIG. 3.

Returning to FIG. 3, in step 82, short timing delays (hereinafter "short delays") are introduced to the simulation sequence 68 of FIG. 2. In one embodiment, the short delays are introduced to the simulation sequence during execution. Preferably, the short delays include a best case, or a minimum, tester-load timing delay and a best case, or a minimum, chip-load timing delay. Since each output state associated with the chip load is subject to a delay that may be different from a delay experienced at a subsequent state in the sequence, the output sequence is asynchronous. FIG. 4 shows an asynchronous short-delay sequence 84 after introducing the short delays to the simulation sequence 68. The simulation sequence 68 of FIG. 4 is the same simulation sequence 68 of FIG. 2B. In the asynchronous sequence 84, a cycle 88 is delayed by a first delay 86 of 5 ns relative to the cycle 70 of the simulation sequence 68. A cycle 92 of the asynchronous sequence is delayed by a second delay 90 of 10 ns relative to the corresponding cycle 70 of the simulation sequence. Finally, a cycle 96 of the asynchronous sequence is delayed by a third delay 94 of 5 ns relative to the corresponding cycle 70 of the simulation sequence. Each delay 86, 90 and 94 includes a combined minimum delay of the chip and the tester. In an event in which a delay has caused a state to cross a boundary into a next base period, the sequence may be shifted along the time domain, so that at least a portion of the crossed-over state is shifted back to its respective base period. Alternatively, the crossed-over state may be masked to avoid a faulty sampling region. Most commercial testers provide for masking of sampling regions by inserting a mask in the file sequence at a specified time and location within the time domain.

In step 98 of FIG. 3, a time overlay is performed on every cycle 88, 92 and 96 of the asynchronous short-delay sequence 84 of FIG. 4 for synchronization. The step of overlaying is performed by time-aligning and correlating every base period 100. As a result, an overlapping (i.e., intersecting) cycle 102 is detectable. As shown, the overlapping cycle is an intersecting time interval of the cycles 88, 92 and 96 within the cumulative base period. The overlapping cycle is indicated by diagonal hatching in a downwardly direction from left to right. In an event in which a cycle does not coincide with the overlapping cycle, the non-overlapping cycle may be masked. While the overlaying step is shown as being performed for three base periods, in operation every base period of the asynchronous sequence 84 is time-overlaid to identify the overlapping cycle.

The clock period having the overlapping cycle 102 is duplicated in every base period 100 in step 104 of FIG. 3. The duplicating step provides a synchronous short-delay sequence 106 of FIG. 4, where the overlapping cycle is repeated in every base period at the identical time location.

Independent of introducing the short delays to the simulation sequence 68 in step 82 of FIG. 3, long timing delays (hereinafter "long delays") are introduced to the simulation sequence in step 109. Preferably, the long delays include a worst case, or a maximum, tester-load timing delay and a worst case, or a maximum, chip-load timing delay. FIG. 4 shows an asynchronous long-delay sequence 110 after introducing the long delays to the simulation sequence 68. In the asynchronous sequence 110, a cycle 114 is delayed by a first delay 112 of 15 ns relative to the corresponding cycle 70 of the simulation sequence 68. A cycle 118 of the asynchronous sequence is delayed by a second delay 116 of 15 ns relative to the corresponding cycle 70 of the simulation sequence. Finally, a cycle 122 of the asynchronous sequence is delayed by a third delay 120 of 10 ns relative to the cycle 70 of the simulation sequence. Each delay 112, 116 and 120 is based on a combined maximum delay of the chip and the tester. In an event in which a delay has caused a state to cross a boundary into a next base period, the sequence may be shifted so that at least a portion of the crossed-over state is shifted back to its respective base period. Alternatively, the crossed-over state may be masked to avoid a faulty sampling region.

Similar to the time overlaying step 98 of FIG. 3, a time overlaying step 124 is performed for the base periods that contain the cycles 114, 118 and 122 of the asynchronous long-delay sequence 110 of FIG. 4. The step of overlaying is performed by time-aligning and correlating every base period 126 to identify an overlapping (i.e., intersecting) cycle 128 in a cumulative period. The overlapping cycle is an intersecting time interval of the cycles 114, 118 and 122 within the base period 126. The base period 126 is equivalent in time to the base period 100.

The cumulative period having the overlapping cycle is duplicated in every base period 126 in step 130 of FIG. 3. The duplicating step provides a synchronous long-delay sequence 132 in which the overlapping cycle is repeated in every successive period at the identical time location.

Figure 5:
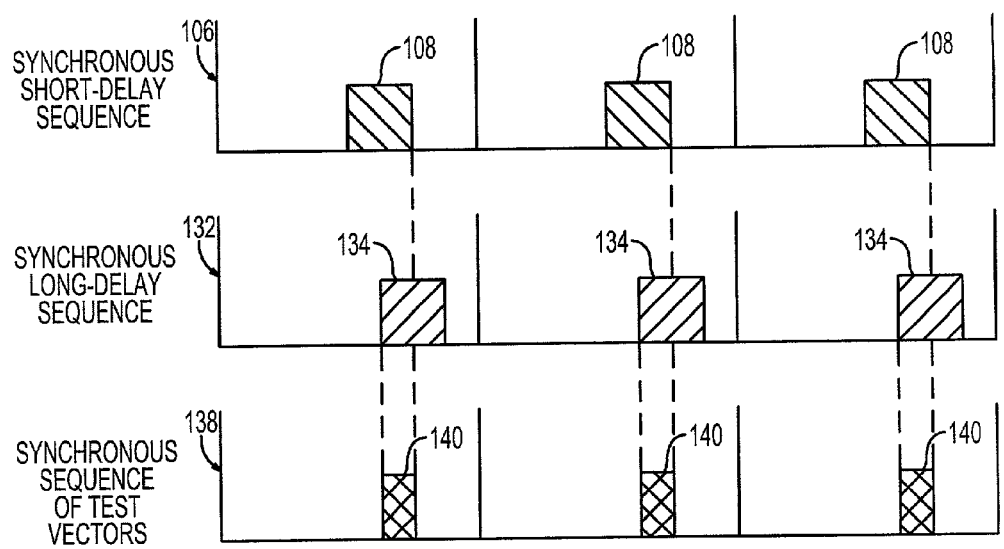
FIG. 5 is a timing diagram illustrating the timing relationship for generating the synchronous sequence of test vectors in accordance with the process flow diagram of FIG. 3.

In step 136 of FIG. 3, a time overlay is performed on the synchronous short-delay sequence 106 and the synchronous long-delay sequence 132 to generate a synchronous sequence 138 of test vectors, as shown in FIG. 5. The synchronous short-delay sequence 106 and the long-delay sequence 132 of FIG. 4 are the same sequences of FIG. 5. The step of overlaying is performed by time aligning and correlating the synchronous sequences 106 and 132 to identify successive overlapping cycles 140. The identified successive overlapping cycles 140 is the synchronous sequence 138 of test vectors. Each overlapping cycle 140 is an intersecting (i.e., coinciding) time interval between a cycle 108 of the synchronous sequence 106 and a corresponding cycle 134 of the synchronous sequence 132. The overlapping cycle is characterized by a rising edge that coincides with a rising edge of the cycle 134 and a falling edge that coincides with a falling edge of the cycle 108. Since the overlaying is performed on the synchronous sequences 106 and 132, the resulting sequence 138 of test vectors is also synchronous.

Figure 6:
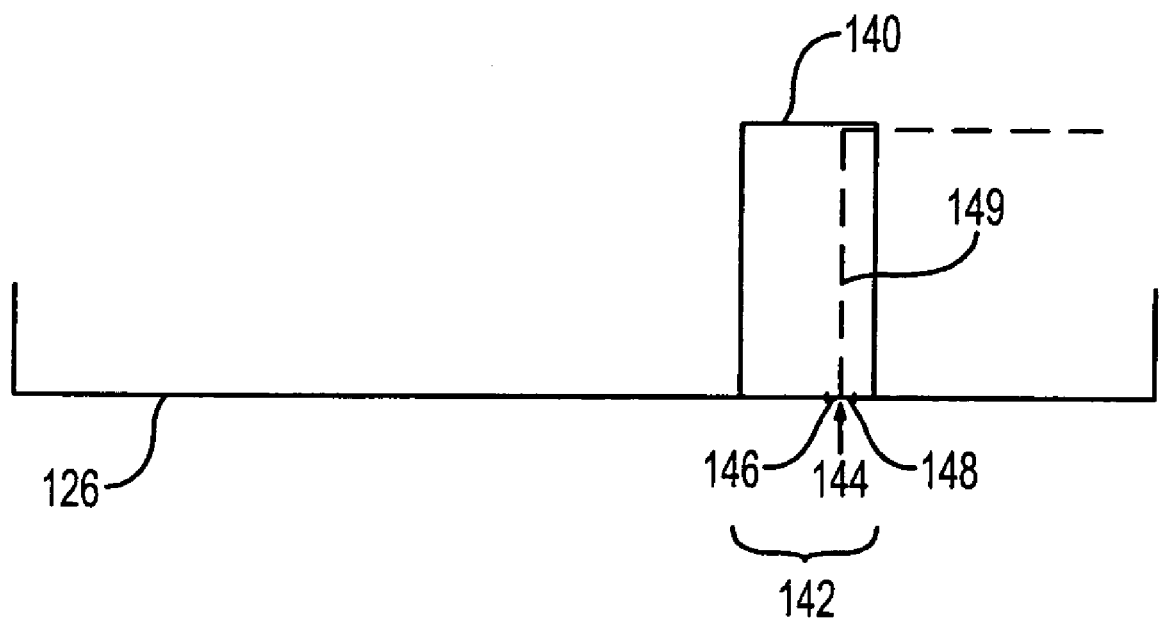
FIG. 6 is an expanded view of an overlaid cycle of the synchronous sequence of test vectors of FIG. 5 having a selected sampling instance.

Each overlapping cycle 140 of the synchronous sequence 138 of test vectors includes a time interval at which an output state can be properly sampled by the tester. FIG. 6 shows an expanded view of the overlapping cycle 140 of FIG. 5 within the base period 126. A sampling instance 144 is fixed at a timing location within a timing interval 142 of the cycle. The location of the sampling instance should correspond to a rising clock edge 149 of the tester cycle. The placement of the sampling instance should include a sufficient time interval 146 (i.e., $T_{setup}$) before the sampling instance and a sufficient time interval 148 (i.e., $T_{hold}$) after the sampling instance, but within the timing interval, to ensure an adequate sampling of data by the tester. The selection of the location of the sampling instance is repeated in every tester period such that the output data of the synchronous sequence of test vectors will be sampled at substantially identical times and locations in successive tester periods.

Returning to the flow diagram 80 of FIG. 3, step 150 is a step of verifying the synchronous sequence 138 of test vectors to ensure that the sequence meets the timing constraints imposed by the load characteristics of the system environment, the tester environment and chip environment. The verifying step is performed by executing the synchronous sequence of test vectors to include the timing delays associated with the system environment, the best and worst case tester-load timing delays of the tester environment, and the best and worst case chip-load timing delays of the chip environment. An output state of the synchronous sequence 138 is sampled by the tester at each sampling instance.

Figure 7:
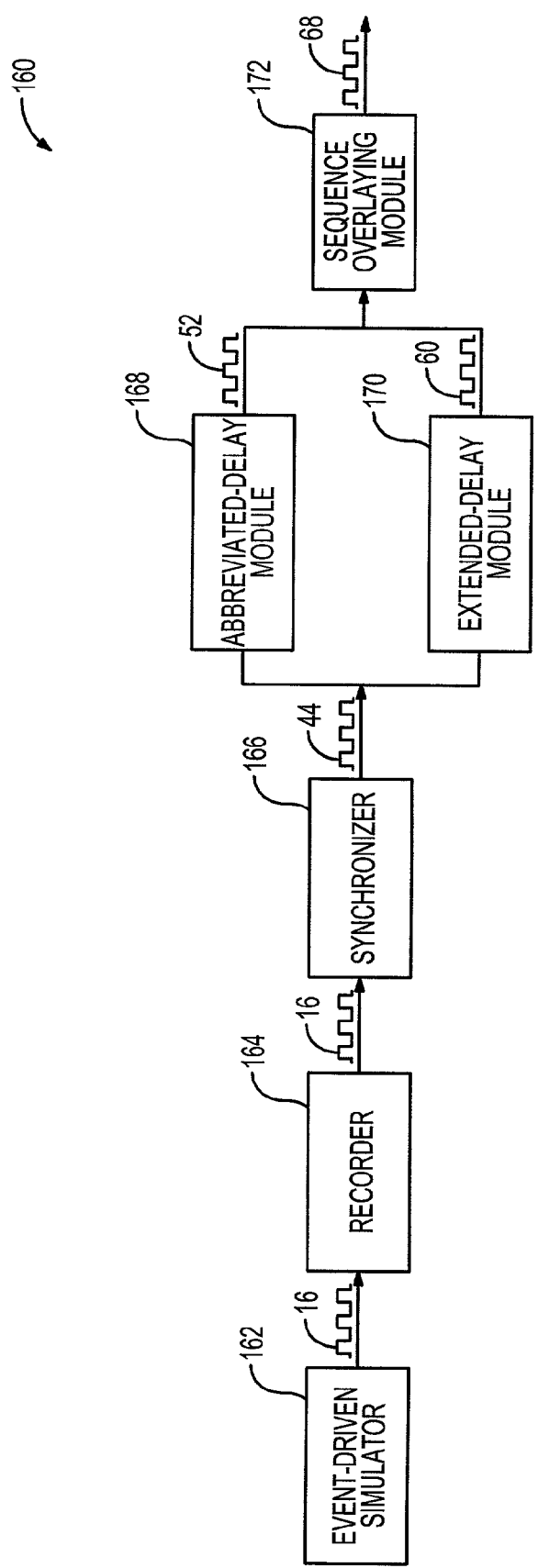
FIG. 7 is a block diagram of a system that is configured to generate the synchronous sequence of test vectors of FIG. 3.
Figure 8:
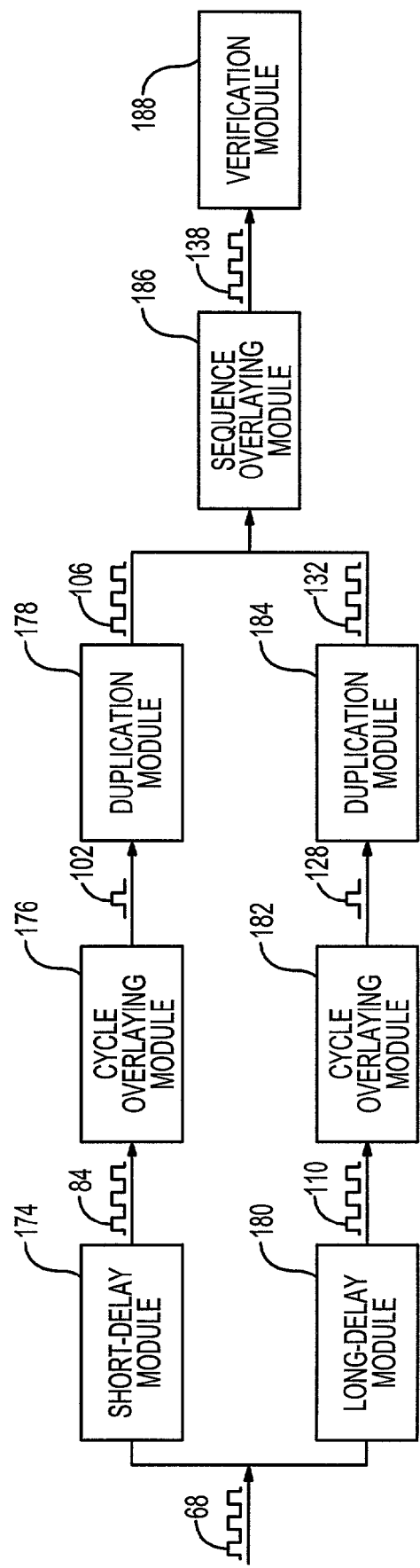
FIG. 8 is a block diagram of the system of FIG. 7 that is configured to generate the synchronous sequence of test vectors.

With reference to FIGS. 7 and 8, a system 160 for generating a synchronous sequence of test vectors from information originating within an asynchronous environment is shown. An event-driven simulator 162 is configured to provide a simulated asynchronous sequence 16 of states for functionally verifying a simulated IC design under a system simulation environment. A recorder 164 records the simulated asynchronous sequence into a recording file, such as a Verilog Control Dump (VCD) file.

A synchronizer 166 synchronizes the simulated asynchronous sequence 16 to generate the simulated synchronous sequence 44. The synchronization is performed by extracting a state of the asynchronous sequence at each base period of a reference clock. Preferably, the time interval of the base period is equivalent to the time interval of the tester clock period of the IC tester.

An abbreviated-delay module 168 introduces delays to the simulated synchronous sequence 44 to generate the simulated synchronous abbreviated-delay sequence 52. In one embodiment, the delay is the estimated best case, or a minimum timing delay, of the system environment, excluding any delays associated with the chip and the tester. Independent of introducing the abbreviated timing delay to the simulated synchronous sequence 44 by the module 168, an extended-delay module 170 introduces a longer timing delay to the simulated synchronous sequence to generate the simulated synchronous extended-delay sequence 60. In one embodiment, the delay is the estimated worst case, or a maximum timing delay, of the system environment, excluding any delays associated with the chip and the tester.

A sequence overlaying module 172 is configured to perform a timing overlay on the simulated synchronous abbreviated-delay sequence 52 and the simulated synchronous extended-delay sequence 60 to generate the simulation (synchronous) sequence 68. The overlaying is performed by time-aligning and correlating the sequences 52 and 60 to identify intersecting time intervals. Since delays associated with the tester and the chip have not been considered, the simulation sequence 68 only provides delays associated with the system environment.

In FIG. 8, a short-delay module 174 is configured to introduce short timing delays to the simulation sequence 68 of FIG. 7 to generate the asynchronous short-delay sequence 84. In one embodiment, the short-delays include a best case, or a minimum, tester-load timing delay and a best case, or minimum, chip-load timing delay. The sequence 84 is asynchronous, since a chip-load timing delay that is associated with an output state may be different from the delay of a next output state. This may be due to a variability in the time taken to perform different functions of the chip. A cycle overlaying module 176 is enabled to perform a timing overlay on every cycle of the asynchronous short-delay sequence 84 to provide an overlapping (i.e., intersecting) time cycle 102. The clock period having the overlapping cycle is duplicated by a duplication module 178 to generate the synchronous short-delay sequence 106.

Similar to, but independent of, introducing the short timing delays to the simulation sequence 68 by the short-delay module 174, a long-delay module 180 is configured to introduce long timing delays to the simulation sequence 68 to generate the asynchronous long-delay sequence 110. In one embodiment, the long delays include a worst case, or a maximum, tester-load timing delay and a worst case, or maximum, chip-load timing delay. A cycle overlaying module 182 is enabled to perform a timing overlay on every cycle of the asynchronous long-delay sequence 110 to provide an overlapping (i.e., intersecting) time cycle 128. The clock period having the overlapping cycle is duplicated by a duplication module 184 to generate the synchronous long-delay sequence 132.

A sequence overlaying module 186 is configured to perform a timing overlay for the synchronous short-delay sequence 106 and the synchronous long-delay sequence 132 to generate a stream of intersecting time intervals that defines the synchronous sequence 138 of test vectors. A verification module 188 verifies the synchronous sequence 138 to ensure that it meets the timing constraints imposed by the system environment, tester environment and chip environment.

While the cycle overlaying modules 176 and 182 are shown as distinct modules, the functions performed by the two modules can be performed by a single cycle overlaying module, typically a software module, without diverging from the scope of the invention. Similarly, the functions performed by the duplication modules 178 and 184 can be performed by a single software and/or hardware duplication module. Moreover, the functions performed by respective sequence overlaying modules 172 of FIG. 7 and 186 of FIG. 8 can be performed by a single sequence overlaying module.

What is claimed is:

1. A computer-implemented method of driving the simulation testing of a design of an integrated circuit (IC) which is to be incorporated into an intended system comprising the steps of:
   providing an asynchronous sequence of states configured for simulating operating conditions relevant to driving sequencing of signal-exchange events with said IC;
   identifying first upper and first lower parameters of timing constraints imposed by said intended system with respect to enabling individual said events;
   forming a first synchronous sequence of states in which said states are synchronized on a basis of remaining within said first upper and first lower parameters of timing constraints;
   identifying second upper and second lower parameters of timing constraints imposed by said IC with respect to enabling individual said events;
   forming a second synchronous sequence of states in which said states are synchronized on a basis of remaining within said second upper and said second lower parameters of timing constraints; and
   using said second synchronous sequence as a basis for said simulation testing of said design.

2. A computer-implemented method of generating a synchronous sequence of test vectors from information originating within an asynchronous environment comprising:
   providing a simulation synchronous sequence of states, wherein each of said states is referenced to a clock period, said simulation synchronous sequence being partially based on event timing parameters of a particular system of interest;
   introducing short timing delays to said states within specific said clock periods of said simulation synchronous sequence to generate an asynchronous short-delay sequence of states, durations of specific said short timing delays being responsive to event timing parameters of a particular integrated circuit (IC) design;
   comparing said states of said asynchronous short-delay sequence, including correlating a plurality of said clock periods having said states of said asynchronous short-delay sequence to identify a first over-lapping time interval, said first overlapping time interval being consistent with a time coincidence among said states of said asynchronous short-delay sequence;
   generating a synchronous short-delay sequence by successively repeating a first delay-adjusted clock period having a state which is delayed by said first overlapping time interval;
   introducing long timing delays to said states within specific said clock periods of said simulation synchronous sequence to generate an asynchronous long-delay sequence of states, durations of specific said long timing delays being responsive to event timing parameters of said particular IC design;
   comparing said states of said asynchronous long-delay sequence, including correlating a plurality of said clock periods having said states of said asynchronous long-delay sequence to identify a second overlapping time interval, said second overlapping time interval being consistent with a time coincidence among said states of said asynchronous long-delay sequence;
   generating a synchronous long-delay sequence by successively repeating a second delay-adjusted clock period having a state which is delayed by said second overlapping time interval; and
   comparing said synchronous short-delay sequence with timing of said states of said synchronous long-delay sequence to generate said synchronous sequence of test vectors, including time aligning said synchronous short-delay and long-delay sequences to detect a plurality of overlapping sampling time intervals for locating said synchronous sequence of test vectors.

3. The computer-implemented method of claim 2 wherein said step of introducing said short timing delays includes adding best case tester-load timing delays to said clock periods of said simulation synchronous sequence, said best case tester-load timing delays being indicative timing constraints of an IC tester.

4. The computer-implemented method of claim 3 wherein said step of introducing said long timing delays includes adding worst case tester-load timing delays that are indicative of said timing constraints of said IC tester.

5. The computer-implemented method of claim 2 wherein said step of introducing said short timing delays includes adding best case chip-load timing delays indicative of timing constraints of said IC design.

6. The computer-implemented method of claim 5 wherein said step of introducing said long timing delays includes adding worst case chip-load timing delays indicative of said timing constraints of said IC design.

7. The computer-implemented method of claim 2 wherein said step of providing said simulation synchronous sequence includes:
   providing a simulated asynchronous sequence of states;
   extracting a state of said asynchronous sequence at each said clock period to generate a simulated synchronous sequence of states;
   introducing an abbreviated liming delay to each said clock period of said simulated synchronous sequence to generate a simulated synchronous abbreviated-delay sequence and introducing an extended timing delay to each said clock period of said simulated synchronous sequence to generate a simulated synchronous extended-delay sequence; and
   comparing said simulated synchronous abbreviated-delay sequence to said simulated synchronous extended-delay sequence, including time aligning said simulated synchronous abbreviated-delay and extended-delay sequences to detect a plurality of overlapping second time intervals for defining positions of states in said clock periods of said simulation synchronous sequence.

8. The computer-implemented method of claim 7 wherein said step of introducing said abbreviated timing delay and said extended timing delay includes executing said simulated synchronous sequence under respective best case timing delay and worst case timing delay scenarios in a system simulation environment, said system simulation environment having timing characteristics indicative of said particular system of interest.

9. The computer-implemented method of claim 7 further including adapting said simulated synchronous extended-delay sequence as said simulation synchronous sequence when there is not an acceptable number of said overlapping second time intervals.

10. The computer-implemented method of claim 7 wherein said step of providing said simulated asynchronous sequence includes selecting said clock period to have a duration that corresponds to a tester clock period of an IC tester.

11. The computer-implemented method of claim 2 further including selectively fixing a sampling instance in one of said overlapping sampling time intervals to correspond to a rising edge of a tester clock period of an IC tester.

12. A test vector generator for generating a synchronous sequence of test vectors comprising:
   a computer-implemented simulation module that is enabled to generate a simulation synchronous sequence of states under a system simulation environment, said simulation synchronous sequence including a plurality of timing regions for identifying operations of an integrated circuit (IC) design;
   a computer-implemented delay module that is enabled to introduce short delays and long delays to said simulation synchronous sequence to respectively generate asynchronous short-delay sequence and asynchronous long-delay sequence, each of said short delays and said long delays being timing delays associated with at least one of an integrated circuit (IC) and an IC tester;
   a computer-implemented overlaying module that is configured to provide a first state overlapping time interval and a second state overlapping time interval by respectively comparing a plurality of base periods of said asynchronous short-delay sequence and comparing a plurality of base periods of said asynchronous long-delay sequence;
   a computer-implemented duplication module that is configured to incorporate said first state overlapping time interval into a first sequence of said base periods and to incorporate said second state overlapping time interval into a second sequence of said base periods to respectively generate a synchronous short-delay sequence and a synchronous long-delay sequence; and
   a computer-implemented sequence overlaying module that is configured to time align said synchronous short-delay sequence and said synchronous long-delay sequence to detect a plurality of overlapping sampling intervals for locating said synchronous sequence of test vectors.

13. The test vector generator of claim 12 wherein said short delays are related to a best case chip-load timing delay of said IC and a best case tester-load timing delay of said IC tester.

14. The test vector generator of claim 13 wherein said long delays are related to a worst case chip-load timing delay of said IC and a worst case tester-load timing delay of said IC tester.

15. The test vector generator of claim 12 further comprising a computer-implemented verification module that is configured to execute said synchronous sequence of test vectors under said short delays and said long delays for verifying timing correctness.

16. The test vector generator of claim 12 wherein said system simulation environment is independent of any delay associated with said IC and said IC tester.

17. The test vector generator of claim 12 wherein said base period is a time interval that is equivalent to a tester period of said IC tester.

18. A computer-implemented method for converting asynchronous states into synchronous states to generate a synchronous sequence of test vectors for verifying functionality of a simulated integrated circuit (IC) design comprising:
   providing a simulation synchronous sequence of states;
   generating an asynchronous short-delay sequence of first periods and an asynchronous long-delay sequence of second periods, including inserting short delays and long delays into said simulation synchronous sequence, said short delays and said long delays characterizing timing delays of at least one of said simulated IC and a tester;
   detecting a short-delay overlapping time interval and a long-delay overlapping time interval, including correlating a plurality of said first periods to identify said short-delay overlapping time interval and correlating a plurality of said second periods to identify said long-delay overlapping time interval;
   generating a synchronous short-delay sequence of states by forming a succession of substantially identical base periods that include a state and said short-delay overlapping time interval;
   generating a synchronous long-delay sequence of states by forming a succession of substantially identical base periods that include a state and said long-delay overlapping time interval; and generating said synchronous sequence of test vectors, including time-aligning said synchronous short-delay sequence and said synchronous long-delay sequence and identifying overlapping timing envelopes of states within corresponding said base periods of said synchronous short-delay and long-delay sequences.

19. The computer-implemented method of claim 18 wherein said step of inserting said short delays and said long delays includes respectively introducing best-case timing delays of said simulated IC and worst-case timing delays of said simulated IC.

20. The computer-implemented method of claim 19 wherein said step of inserting said short delays and said long delays includes respectively introducing best-case timing delays of said tester and worst-case timing delays of said tester.

* * * * *

UNITED STATES PATENT AND TRADEMARK OFFICE
CERTIFICATE OF CORRECTION

PATENT NO. : 6,980,943 B2 Page 1 of 1
APPLICATION NO. : 10/020562
DATED : December 27, 2005
INVENTOR(S) : Robert Aitken It is certified that error appears in the above-identified patent and that said Letters Patent is hereby corrected as shown below:

Col. 13 Line 18 In Claim 7, delete "liming" and insert -- timing --, therefor.

Signed and Sealed this

Twenty-fourth Day of February, 2009

JOHN DOLL
*Acting Director of the United States Patent and Trademark Office*